United States Patent
Kim (10) Patent No.: US 8,350,321 B2
(45) Date of Patent: *Jan. 8, 2013

(54) SEMICONDUCTOR DEVICE HAVING SADDLE FIN TRANSISTOR AND MANUFACTURING METHOD OF THE SAME

(75) Inventor: Kyu tae Kim, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 138 days.

This patent is subject to a terminal disclaimer.

(21) Appl. No.: 12/494,241

(22) Filed: Jun. 29, 2009

(65) Prior Publication Data

US 2010/0219467 A1     Sep. 2, 2010

(30) Foreign Application Priority Data

Mar. 2, 2009   (KR) .................. 10-2009-0017600

(51) Int. Cl.
*H01L 29/66*   (2006.01)

(52) U.S. Cl. ........ 257/330; 257/332; 257/397; 257/296; 257/301; 257/302; 438/259; 438/270; 438/271; 438/589

(58) Field of Classification Search .......... 257/330–332, 257/397, 296, 301, 302; 438/259, 270, 271, 438/589

See application file for complete search history.

(56) References Cited

U.S. PATENT DOCUMENTS

| | | | | |
|---|---|---|---|---|
| 5,900,659 A * | 5/1999 | Lee | ................. | 257/296 |
| 6,268,264 B1 * | 7/2001 | Tseng | ................. | 438/424 |
| 7,217,623 B2 * | 5/2007 | Kim et al. | ................. | 438/283 |
| 7,285,812 B2 * | 10/2007 | Tang et al. | ................. | 257/296 |
| 7,410,870 B2 * | 8/2008 | Kim et al. | ................. | 438/257 |
| 7,521,322 B2 * | 4/2009 | Tang et al. | ................. | 438/270 |
| 7,566,621 B2 * | 7/2009 | Kim | ................. | 438/270 |
| 7,569,878 B2 * | 8/2009 | Weis et al. | ................. | 257/301 |
| 7,687,355 B2 * | 3/2010 | Sheen et al. | ................. | 438/283 |
| 7,700,983 B2 * | 4/2010 | Popp et al. | ................. | 257/296 |
| 7,800,170 B1 * | 9/2010 | He et al. | ................. | 257/330 |
| 7,816,209 B2 * | 10/2010 | Yang et al. | ................. | 438/270 |
| 7,923,784 B2 * | 4/2011 | Chae et al. | ................. | 257/368 |
| 2006/0261393 A1 * | 11/2006 | Tang et al. | ................. | 257/296 |
| 2006/0273382 A1 * | 12/2006 | Hshieh | ................. | 257/330 |
| 2007/0138523 A1 * | 6/2007 | Popp et al. | ................. | 257/296 |
| 2007/0155148 A1 * | 7/2007 | Kim | ................. | 438/589 |
| 2007/0176245 A1 * | 8/2007 | Kim et al. | ................. | 257/401 |
| 2007/0267676 A1 * | 11/2007 | Kim et al. | ................. | 257/311 |
| 2007/0281455 A1 * | 12/2007 | Kim | ................. | 438/589 |
| 2008/0014695 A1 * | 1/2008 | Lee et al. | ................. | 438/239 |
| 2008/0081421 A1 * | 4/2008 | Lim et al. | ................. | 438/270 |
| 2008/0099850 A1 | 5/2008 | Jeon et al. | | |
| 2008/0142882 A1 * | 6/2008 | Tang et al. | ................. | 257/330 |
| 2008/0203455 A1 * | 8/2008 | Jang et al. | ................. | 257/306 |
| 2009/0014786 A1 * | 1/2009 | Lee et al. | ................. | 257/330 |
| 2009/0026530 A1 * | 1/2009 | Wilson et al. | ................. | 257/328 |
| 2009/0090947 A1 * | 4/2009 | Yoon et al. | ................. | 257/296 |

(Continued)

FOREIGN PATENT DOCUMENTS

KR     1020060062534 A     6/2006

(Continued)

*Primary Examiner* — Fernando L Toledo
*Assistant Examiner* — Mohammed Shamsuzzaman (57) ABSTRACT

The present invention discloses a transistor having the saddle fin structure. The saddle fin transistor of the present invention has a structure in which a landing plug contact region, particularly, a landing plug contact region on an isolation layer is elevated such that the landing plug contact SAC (Self Aligned Contact) fail can be prevented.

10 Claims, 9 Drawing Sheets

U.S. PATENT DOCUMENTS

| | | | |
|---|---|---|---|
| 2009/0152611 A1* | 6/2009 | Fujimoto | 257/296 |
| 2009/0152625 A1* | 6/2009 | Lee et al. | 257/330 |
| 2009/0278183 A1* | 11/2009 | Lee | 257/296 |
| 2009/0294874 A1* | 12/2009 | Lee | 257/401 |
| 2010/0117148 A1* | 5/2010 | Kim et al. | 257/330 |

FOREIGN PATENT DOCUMENTS

KR    1020070017656 A    2/2007

* cited by examiner

SEMICONDUCTOR DEVICE HAVING SADDLE FIN TRANSISTOR AND MANUFACTURING METHOD OF THE SAME

CROSS-REFERENCE TO RELATED APPLICATION

The priority of Korean patent application No. 10-2009-0017600 filed Mar. 2, 2009, the disclosure of which is hereby incorporated in its entirety by reference, is claimed.

BACKGROUND OF THE INVENTION

The present invention relates to a saddle fin transistor having an elevated landing plug contact and manufacturing method of the same.

In a photolithography process (one of many processes for manufacturing a semiconductor device), a photomask for forming a pattern is and essential requirement. The photomask includes a mask pattern which defines various elements of semiconductor device. The size of mask pattern elements becomes gradually smaller (i.e., density increases) according to the integration of the device. The channel length and channel width of transistor are reduced as the design rule of the semiconductor device is reduced. Consequently, in attaining the threshold voltage Vt required in a high integration semiconductor device, the conventional planar transistor structure is confronted with a limit. In order to overcome this limit, various types of transistors are suggested, and one of them is a fin transistor.

Figure 1:
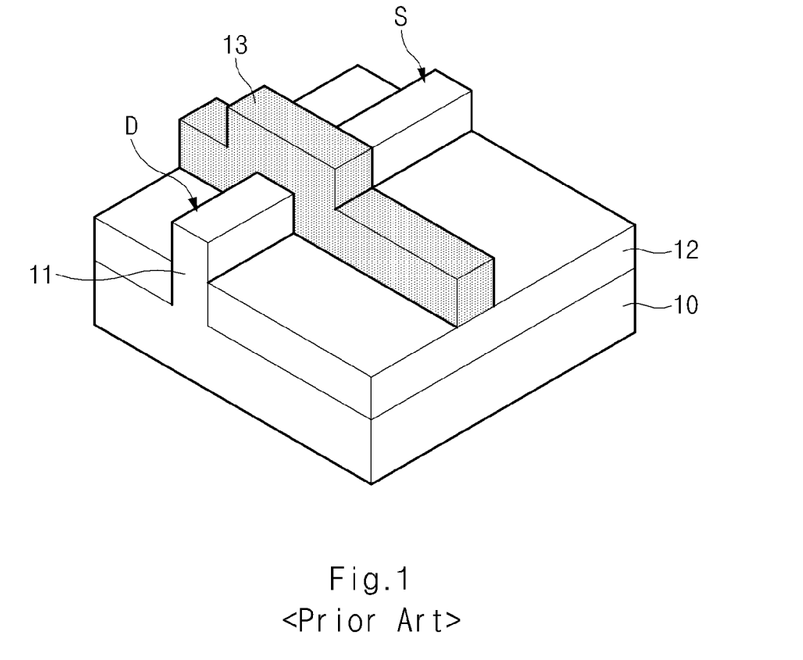
FIG. 1 is a drawing illustrating a structure of a general fin transistor.

FIG. 1 is a drawing illustrating the structure of conventional fin transistor.

A fin transistor is formed in such a manner that an active region 11 of a semiconductor substrate 10 is formed to be protruded than an isolation layer 12 while a gate electrode 13 is formed cross over the protruded active region 11. In the fin transistor, the channel width of a transistor is increased as much as the protruded height such that the current drivability can be improved and the operation speed can be increased.

However, in case of the fin structure, the junction leakage current can be increased due to the enlargement of the channel region. Accordingly, the fin structure has some drawbacks when applied to a cell transistor which requires a sufficient data retention time.

Figure 2:
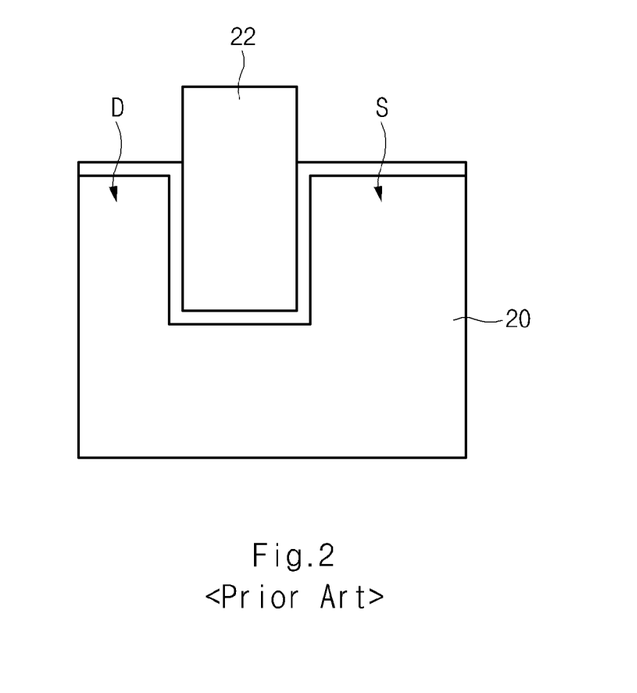
FIG. 2 is a drawing which schematically illustrating a structure of a recess transistor which is proposed so as to secure a data retention time.

FIG. 2 is a drawing which schematically illustrates the structure of a recess transistor which has been proposed to secure a data retention time.

In the recess transistor, a semiconductor substrate 20 of a gate 22 region is etched with a given depth, so that the distance between the source and the drain is extended.

However, such a recess transistor can secure a data retention time but the current drivability is not as good as the fin transistor.

Accordingly, the Saddle Fin FET has been recently proposed, which implements features of the fin transistor and the recess transistor within one cell to have both the current drivability of the fin transistor and the data retention time of the recess transistor.

Figure 3:
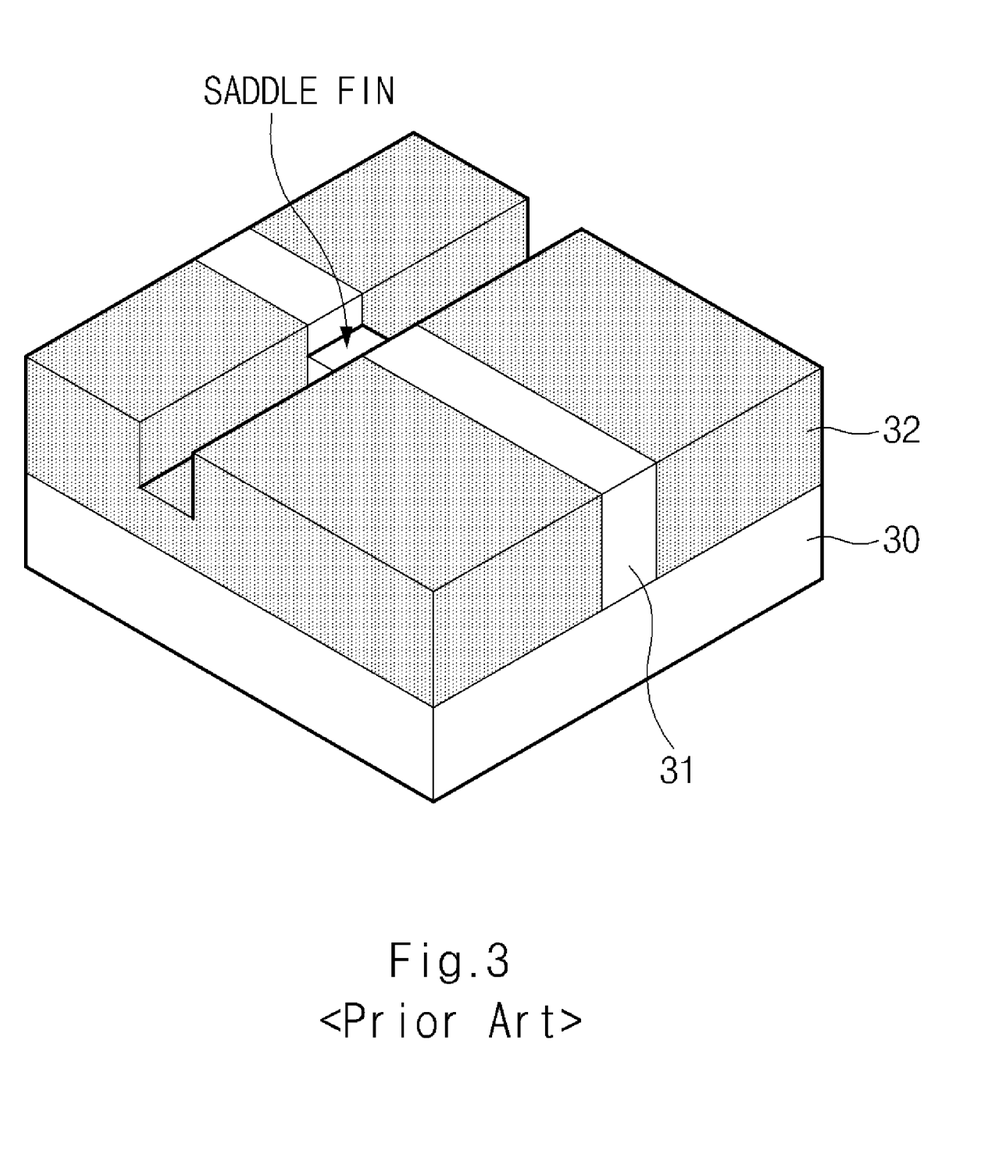
FIG. 3 is a drawing illustrating a structure of a general saddle fin transistor.

FIG. 3 is a drawing illustrating the structure of conventional saddle fin transistor.

The saddle fin transistor has a channel region of recess structure in which an active region 31 of a semiconductor substrate 30 is etched to a given depth in a gate region, while having the structure in which the isolation layer 32 is more etched than the channel region such that the channel region has a protruded structure. The protruded channel region is named as a saddle fin.

Since the saddle fin transistor secures a stable refresh characteristic with the recess gate structure and the floor side of the recess gate is formed with the fin structure, the width of the channel is increased and current drivability is improved.

Figure 4:
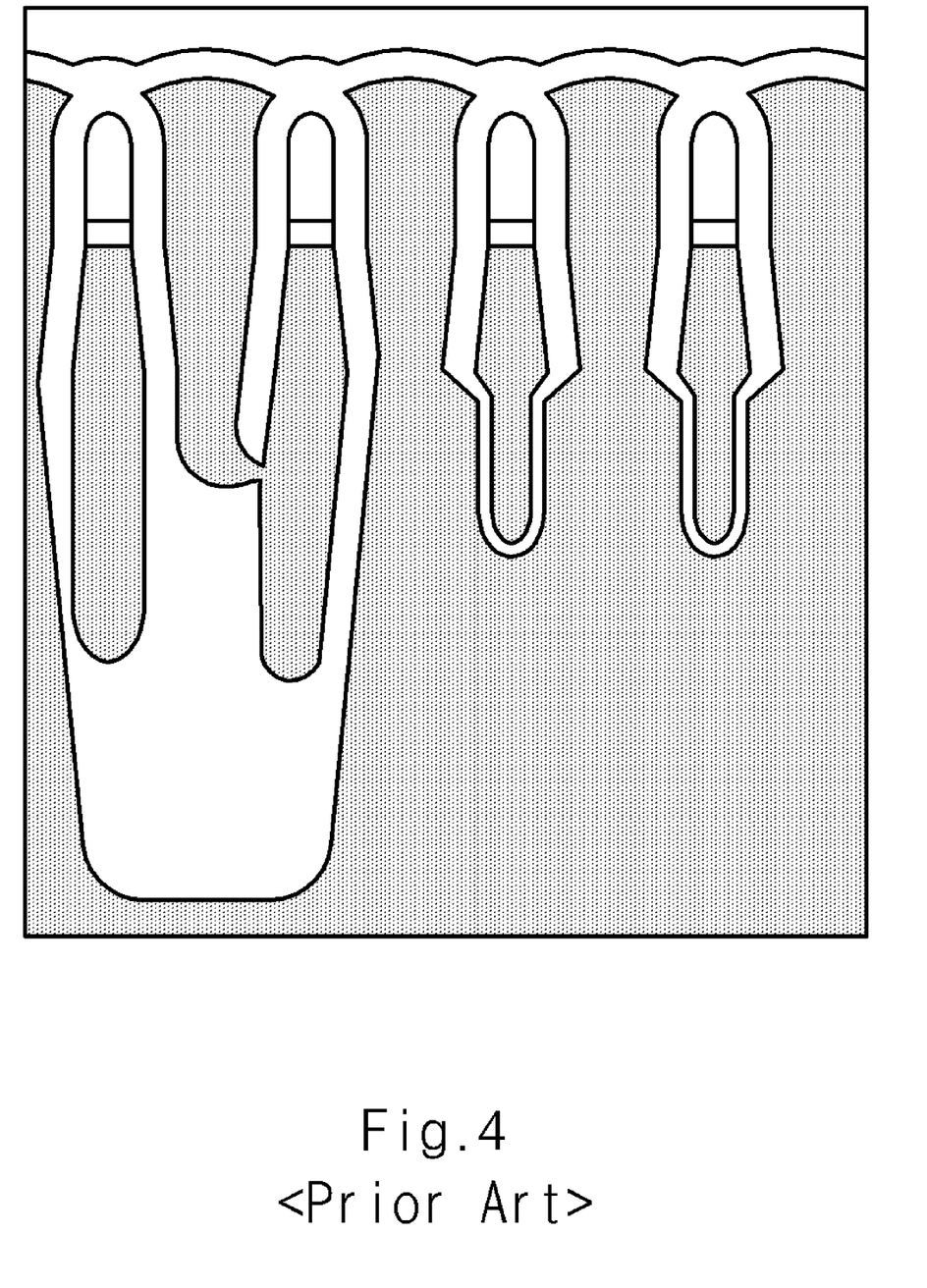
FIG. 4 is a SEM picture illustrating an actual generation of the fail of LPC (landing plug contact) SAC (Self Aligned Contact).

However, during the manufacturing process for the saddle fin transistor a significant amount of isolation layer needs to be etched. Thus, the misalign of gate can be generated. Further, if the isolation layer is not sufficiently strong, as shown in FIG. 4, during the forming of the landing plug contact (LPC), the landing plug contact (LPC) self aligned contact (SAC) fail can be generated within the isolation.

Recently, instead of a conventional HDP (High Density Plasma) insulating layer, the SOD (Spin On Dielectric) insulating layer has been used as an isolation layer. The SOD insulating layer has a better gap fill characteristic, so that the gap fill between the active regions can be better performed.

However, with the SOD insulating layer, since the etch rate in the wet etching is very high in comparison with the HDP insulating layer, the occurrence of the above problem (see FIG. 4) can be increased.

Moreover, due to the loss of the SOD insulating layer, the gap between field isolation regions is reduced. This can cause an increase in the signal interference phenomenon which affects a main gate arranged in an active region by a passing gate arranged on the SOD insulating layer (isolation layer).

Consequently, the GIDL (Gate Induced Drain Leakage) current is increased such that the short channel margin of transistor is reduced. Particularly, in the DRAM device, since the data retention time is reduced and the normal operation becomes difficult, the yield and reliability of the device are lowered.

BRIEF SUMMARY OF THE INVENTION

Various embodiments of the invention are directed to providing a saddle fin transistor having an elevated landing plug contact and manufacturing method of the same.

According to an embodiment of the present invention, a semiconductor device having a saddle fin transistor, comprising: a recess formed in a gate region; a gate electrode filling the recess and extending to a higher level than an isolation layer; and an elevated landing contact plug formed on an elevated region of the isolation layer defining the active region, the top surface of the elevated region being at a higher level than a top surface of other region of the isolation layer.

The present invention can structurally prevent the landing plug contact(LPC) SAC fail by improving the structure of saddle fin transistor.

According to another embodiment of the present invention, a semiconductor device having a saddle fin transistor, comprising: a recess in which an active region of a gate region is formed to be protruded than an isolation layer of the gate region; an elevated region defined on the active region and isolation layer, the top surface of the elevated region being at a higher level than a top surface of other region of active region and the isolation layer, respectively; and a landing plug contact formed on the elevated region.

Preferably, the saddle fin transistor further comprises a spacer formed with a nitride layer on the side wall of the elevated region. A space between the landing plug contact and the gate can be more secured by such spacer.

Preferably, the elevated region has a height from 500 Å to 1000 Å.

According to an embodiment of the present invention, a method of forming a saddle fin transistor comprises: forming an isolation layer defining an active region; forming an elevated region by etching a region excepting a landing plug contact region; forming a recess by etching the isolation layer and the active region of a gate region; filling the recess with conductive material to form a gate electrode; and forming a landing contact plug on the elevated region.

Preferably, the elevated region has a height from 55 Å to 1000 Å.

Preferably, the forming-a-recess step is performed in such a manner that a bottom of the isolation layer is lower than a bottom of the active region in the gate region.

Preferably, the forming-a-recess step further comprises a step of forming a nitride layer over the elevated region.

Preferably, the filling-the-recess step further comprises a step of forming a spacer on the side wall of the elevated region by removing the nitride layer on the top surface of the elevated region.

Preferably, the filling-the-recess step comprises: forming a gate oxidation layer on a semiconductor substrate exposed by the recess through performing a gate oxidation process; successively forming a polysilicon layer, a conductive layer and a hard mask layer; and successively etching the hard mask layer, the conductive layer and the polysilicon layer by using a gate mask.

DESCRIPTION OF EMBODIMENTS

Figure 5:
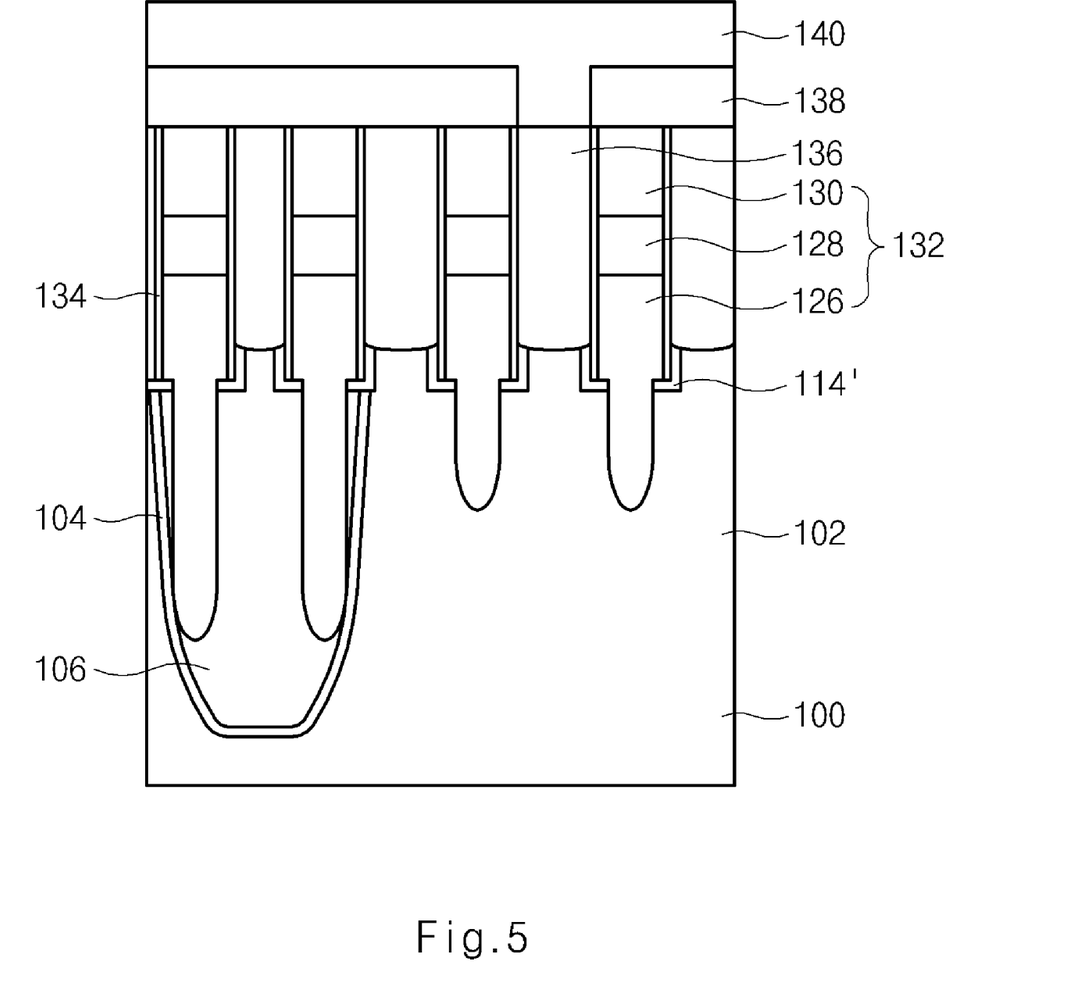
FIG. 5 is a cross-sectional view illustrating a structure of a saddle fin transistor having an elevated landing plug structure according to the present invention.
Figure 6:
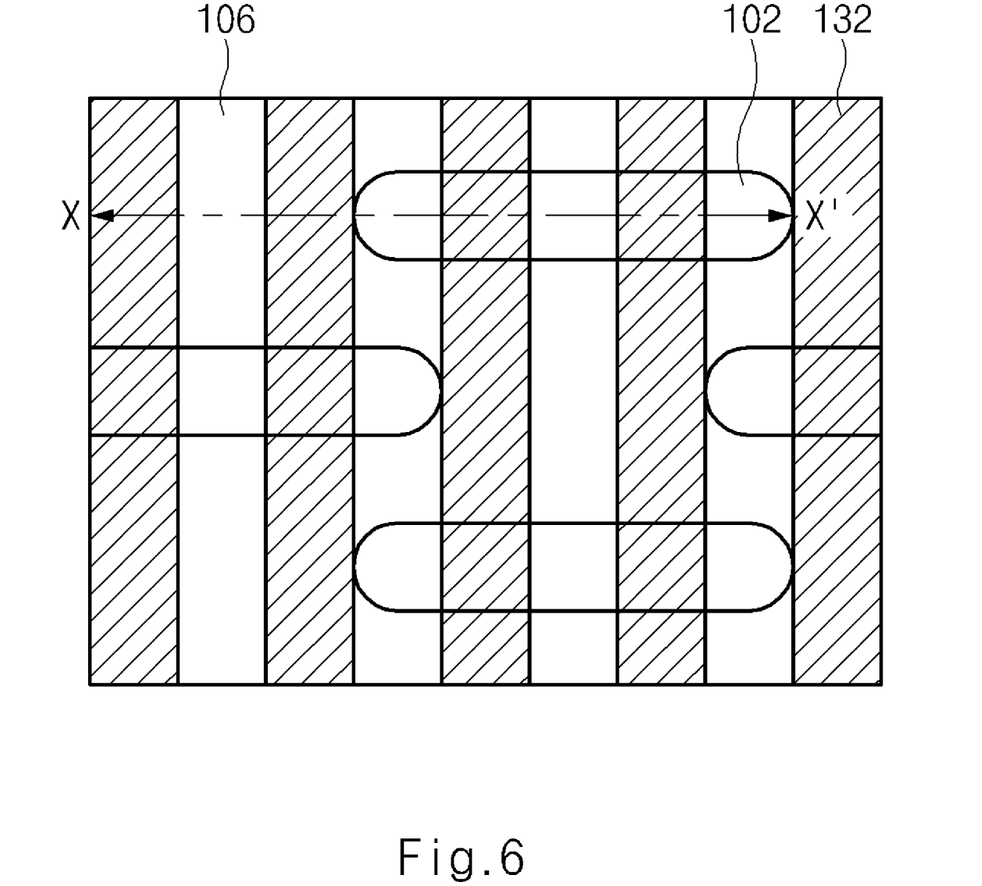
FIG. 6 is a plan view of semiconductor according to the present invention.

FIG. 5 is a cross-sectional view illustrating a structure of a saddle fin transistor having a elevated landing plug structure according to the present invention, illustrating a cross-sectional view taken along X-X' in a plane view of FIG. 6.

An active region 102 of a semiconductor substrate 100 is defined by an isolation layer 106, and formed to be crossed with a gate region 132. At this time, in the gate region 132, the active region 102 is formed with a saddle fin structure which is protruded higher than the adjacent isolation layer 106 with a certain level while being formed with a recess structure.

This saddle fin structure increases the channel width while securing a stable refresh characteristic with the recess gate structure.

The gate region (or gate electrode) 132 has a structure in which a polysilicon pattern 126, a conduction layer pattern 128 and a hard mask layer pattern 130 are stacked. At this time, the conduction layer can include tungsten, tungsten silicide or a stack structure of those materials. A gate spacer 134 is formed in the side wall of the gate 132.

Furthermore, the saddle fin transistor of the present invention has the elevated LPC (landing plug contact) structure in which the landing plug contact region is formed to be higher than the other with a certain level. That is, the active region and isolation layer of the landing plug contact region are formed to be higher than the other active region and isolation layer with a certain level. At this time, the elevated region is formed to a height of about 55 Å~1000 Å in the present embodiment.

A nitride layer spacer 114' is formed on the side of the elevated landing plug contact such that a space between a landing plug contact 136 and a gate 132 can be sufficiently secured.

FIGS. 7 to 13 are sectional views for illustrating a manufacturing method of a saddle fin transistor according to the present invention.

Figure 7:
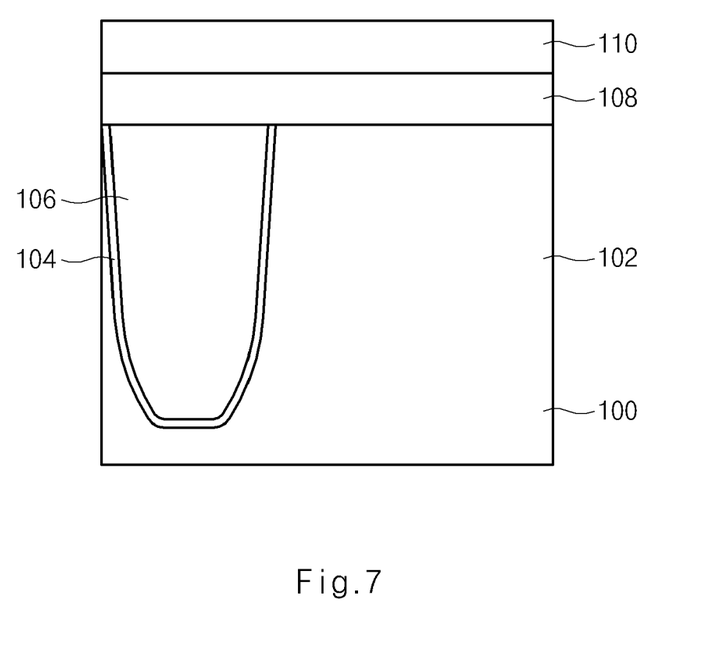
FIGS. 7 to 13 are sectional views for illustrating a manufacturing method of a saddle fin transistor according to the present invention.

Referring to FIG. 7, a pad oxide film (not shown) and a pad nitride layer (not shown) are successively formed on a semiconductor substrate 100. A trench (not shown) is formed to form an isolation layer defining an active region 102 through the etching process using the STI (Shallow Trench Isolation) mask. At this time, the etching process is performed with a dry etching process.

Then, a side wall oxide layer (not shown) is formed on the surface of the trench while a liner nitride layer 104 is formed on a resultant structure including the side wall oxide layer. An insulating material like the SOD (Spin On Dielectric) oxide layer (not shown) is evaporated so that the trench be completely buried on the liner nitride layer 104. A SOD oxide layer (not shown) and the liner nitride layer 104 is planarized with a CMP (Chemical Mechanical Polishing) until the pad nitride layer (not shown) is exposed.

The exposed pad nitride layer and pad oxide layer are successively removed to form an isolation layer 106 while a hard mask layer 108 and a photoresist 110 are formed on a resultant structure. At this time, the hard mask layer 108 can be formed, for example, a stacked structure with an amorphous carbon layer and silicon oxide nitride (SiON) layer.

Figure 8:
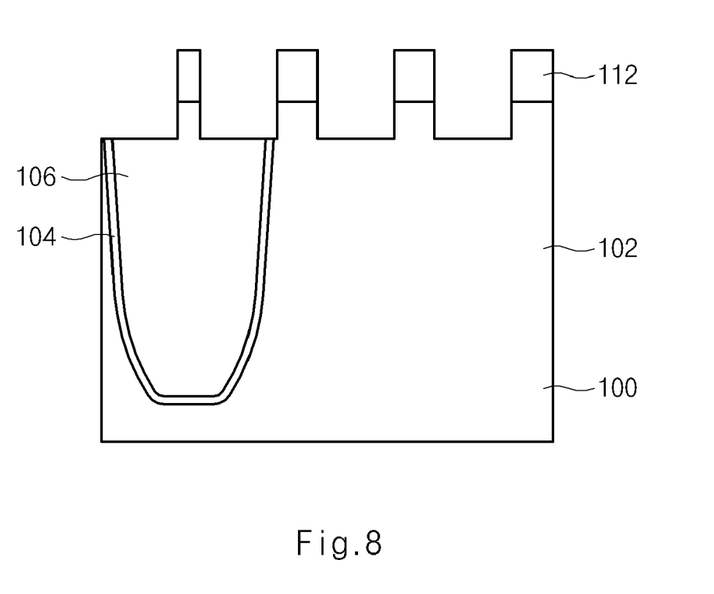

Referring to FIG. 8, after the photoresist 110 is exposed by using a mask (not shown) defining a landing plug contact region, the exposed photoresist is developed to form a photoresist pattern (not shown). The hard mask layer 108 is etched with the photoresist pattern as an etching mask, so that a hard mask layer pattern 112 is formed.

Then, the active region 102 and the isolation layer 106 are etched to a certain depth using the photoresist pattern and the hard mask layer pattern 112 as an etching mask such that the elevated LPC(landing plug contact) is formed. The photoresist pattern is removed through the strip process.

That is, as the other region excepting a landing plug contact region is etched to a given depth, the landing plug contact region is elevated to a given height.

At this time, the active region 102 and the isolation layer 106 are etched to a depth of about 55 Å~1000 Å. That is, the elevated region of the active region 102 and the isolation layer 106 has a height from 55 Å to 1000 Å.

Figure 9:
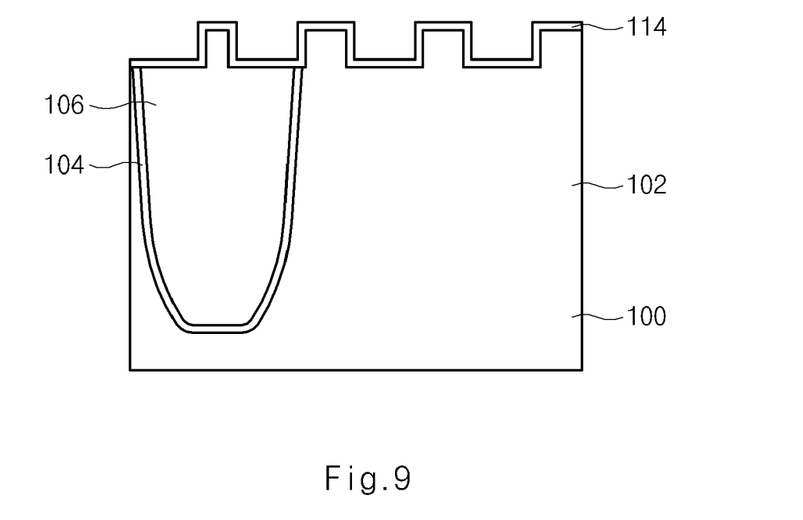

Referring to FIG. 9, after the hard mask layer pattern 112 is removed, a nitride layer 114 is formed on a resultant structure. The nitride layer 114 is used in a subsequent process when a spacer is formed on the side wall of the elevated region.

Figure 10:
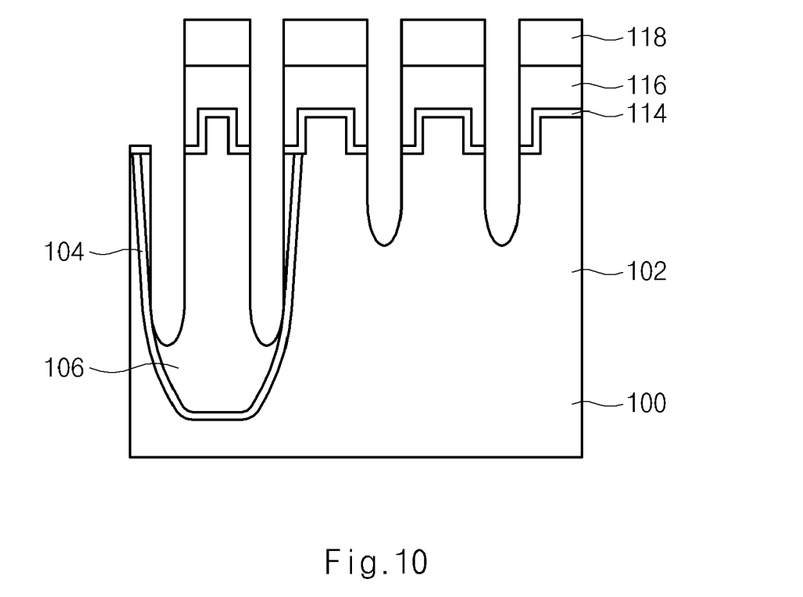

Referring to FIG. 10, a hard mask layer (not shown) and a photoresist (not shown) are formed over the nitride layer 114. Then, the photoresist is exposed by using a saddle fin mask and the exposed photoresist is developed, so that a photoresist pattern 118 is formed. The hard mask layer is etched with the photoresist pattern 118 as an etching mask such that a hard mask layer pattern 116 is formed.

The active region 102 and isolation layer 106 of the gate region are etched with a different depth by a fin etching process using the photoresist pattern 118 and the hard mask layer pattern 116 as an etch mask. This forms a channel region of a saddle fin structure.

That is, the isolation layer 106 of the gate region is etched more deeply than the active region 102 such that a channel region of saddle fin structure in which the etched active region (channel region) 102 is protruded than the etched isolation layer 106 is formed.

Such etching process can be performed by etch selectivity between the active region 102 and the isolation layer 106.

Figure 11:
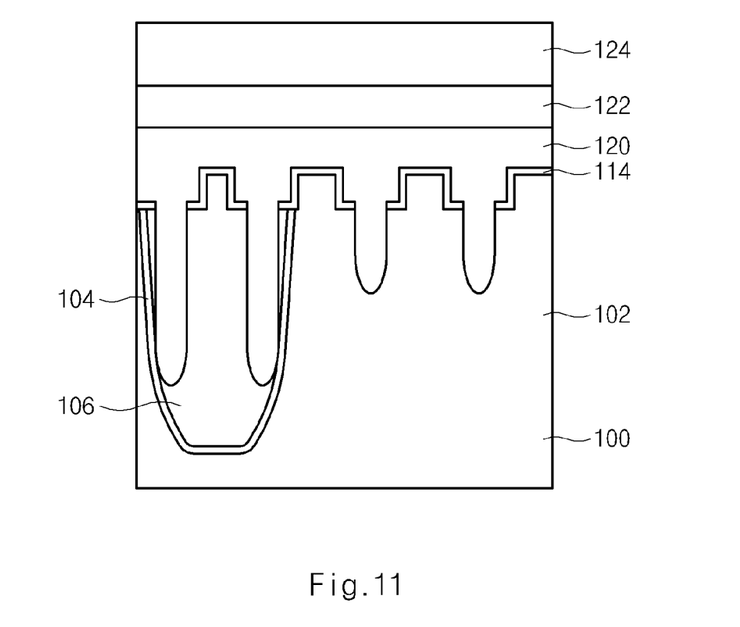

Referring to FIG. 11, after the photoresist pattern 118 and the hard mask layer pattern 116 are successively removed, a gate oxidation layer (not shown) is formed on semiconductor substrate 102 which is exposed through the gate oxidation process.

Then, a polysilicon layer 120, a conduction layer 122 and a hard mask layer 124 are successively formed in the gate region so that the saddle fin is buried. At this time, the conduction layer 122 can be formed including tungsten, tungsten silicide or a stacked structure of these materials.

Figure 12:
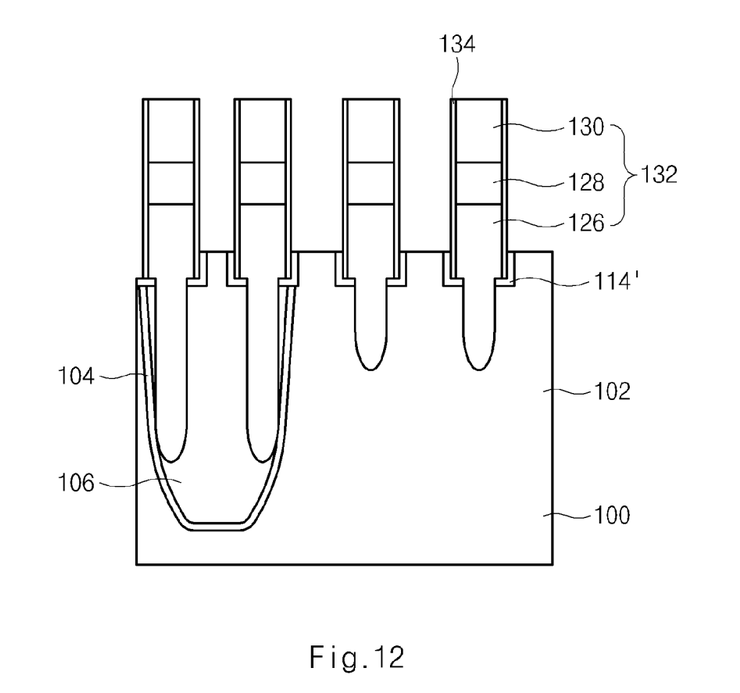

Referring to FIG. 12, the hard mask layer 124, the conduction layer 122 and the polysilicon layer 120 are successively etched by using the gate mask (not shown). This forms a gate 132 which is a stacked structure of a polysilicon pattern 126, a conduction layer pattern 128 and a hard mask layer pattern 130.

A nitride layer formed on the elevated landing plug contact is also etched during the gate (or gate electrode) 132 forming process. As a result, a nitride layer spacer 114' is formed on the side wall of the elevated region.

Then, a nitride layer (not shown) is formed on a resultant structure and an etch back is performed on the nitride layer so that a gate spacer 134 is formed.

Figure 13:
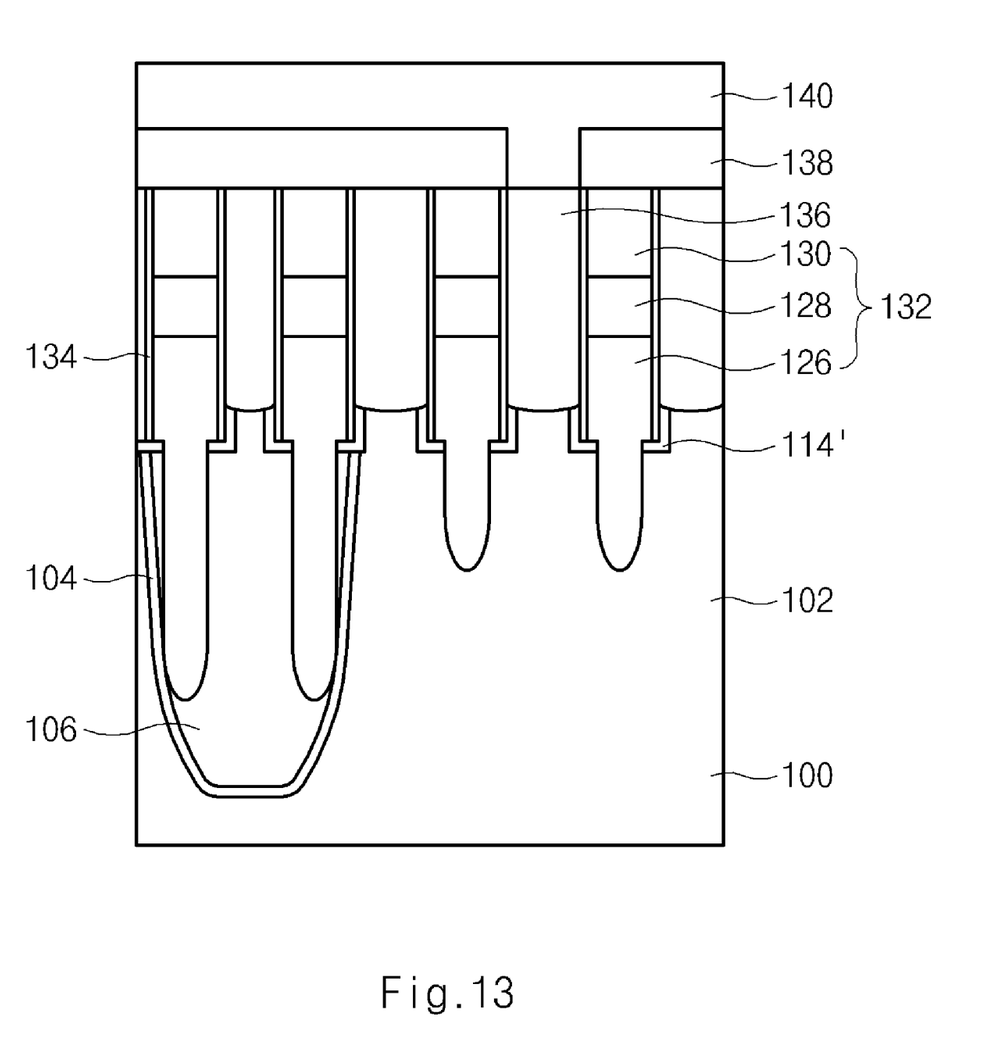

Referring to FIG. 13, after an interlayer insulating layer (not shown) is formed on a resultant structure of FIG. 12 and cells are electrically separated, the interlayer insulating layer is etched until the hard mask layer pattern 130 of the gate pattern 132 is exposed.

The interlayer insulating layer is selectively etched by using the landing plug contact mask until the top surface of the elevated region is exposed, so that a landing plug contact hole (not shown) is formed. Then, a landing plug poly (LPP) is deposited to fill in the landing plug contact hole.

When the landing plug poly is etch by the CMP until the hard mask layer pattern 130 is exposed to form a landing plug contact 136, an interlayer insulating layer 138 is formed on a resultant structure.

The interlayer insulating layer 138 is selectively etched by a bit line contact mask until the landing plug contact 136 is exposed, so that a bit line contact hole (not shown) is formed. A conduction layer for a bit line (not shown) is formed in such a manner that the bit line contact hole is buried.

A bit line 140 is formed as the conduction layer is patterned with a bit line mask.

As described above, the present invention can fundamentally solve the problem that the landing plug contact and the recess gate are shorted in the isolation layer, by forming landing plug contact into an elevated structure.

Furthermore, the present invention enables to sufficiently secure a space between the polysilicon pattern 126 of the gate 132 and the landing plug contact 136 formed in a subsequent process, by forming the nitride layer spacer 114' on the side wall of the elevated landing plug contact. Accordingly, the thickness of the gate spacer can be more tenuously formed.

In the above-described embodiment, it was explained that the elevated landing plug contact is formed both on the active region and on the isolation layer, but the present invention is not limitative. For example, in the formation of the landing plug contact, the LPC SAC (Self Aligned Contact) fail is often generated in the isolation layer, accordingly, the elevated landing plug contact can be formed only in the isolation layer among the landing plug contact region.

As described above, in order to form the elevated landing plug contact only in the isolation layer, it is required that the isolation layer is selectively etched by using a mask defining a region excepting the landing plug contact region among the isolation layer instead of the mask which defines the landing plug contact region in the process of FIG. 8.

The description of following process will be omitted as a person skilled in the art can easily know it through the process of the above-described FIGS. 9 to 13.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory DRAM device or non volatile memory device. Other additions, subtractions, or modifications are obvious in view of the present disclosure and are intended to fall within the scope of the appended claims.

What is claimed is:

1. A method of forming a semiconductor having a saddle fin transistor, the method comprising:
   forming an isolation layer defining an active region;
   forming an elevated region by etching a first gate recess to a first depth in the isolation layer and a second gate recess to a second depth in the active region;
   forming a first trench and a second trench by etching the first and second gate recesses to a third depth and a fourth depth, respectively;
   filling the trenches with conductive material to form gate electrodes; and
   forming a landing contact plug on the elevated region,
   wherein a width of the first trench is narrower than a width of the first gate recess and a width of the second trench is narrower than a width of the second recess, and either of the third and fourth depths are greater than either of the first and second depths.

2. The method according to claim 1, wherein the elevated region has a height of 500 Å-1000 Å.

3. The method according to claim 1, wherein forming the first and second gate recesses further comprises a step of forming a nitride layer over the elevated region.

4. The method according to claim 3, wherein the step of filling the trenches further comprises a step of forming a spacer on a side wall of the elevated region by removing the nitride layer on a top surface of the elevated region.

5. The method according to claim 1, wherein the step of filling the trenches comprises:
   forming a gate oxidation layer on a portion of a semiconductor substrate exposed by the recess through performing a gate oxidation process;
   successively forming a polysilicon layer, a conductive layer and a hard mask layer; and
   successively etching the hard mask layer, the conductive layer and the polysilicon layer by using a gate mask.

6. A method of forming a semiconductor with a saddle fin transistor, the method comprising:
   forming an isolation layer defining an active region in a semiconductor substrate;
   etching a first gate recess to a first depth in the active region;

etching a second gate recess to a second depth in the isolation layer;

forming a hard mask pattern over an elevated region disposed between the first gate recess and the second gate recess, over a portion of the first gate recess, and over a portion of the second gate recess;

etching the first gate recess and the second gate recess to a third depth and a fourth depth, respectively, using the hard mask pattern to form a first trench in the first gate recess and a second trench in the second gate recess;

filling the first gate recess, the first gate trench, the second gate recess, and the second gate trench with a conductive material to form gate electrodes; and forming a landing contact plug over the elevated region, wherein a width of the first trench is narrower than a width of the first gate recess and a width of the second trench is narrower than a width of the second recess, and either of the third and fourth depths are greater than either of the first and second depths.

7. The method of claim 6, wherein forming the hard mask pattern further includes:

forming a hard mask layer;

forming a photoresist pattern over the hard mask layer; and etching the hard mask layer using the photoresist pattern to form a hard mask pattern.

8. The method of claim 6, further including:

forming a first nitride layer spacer, wherein forming the nitride layer spacer includes:

forming a first nitride layer over the semiconductor substrate including the first and second gate recesses, etching the nitride layer while etching the gate recesses to form the trenches, and removing a portion of the nitride layer disposed over the elevated region.

9. The method of claim 6, wherein the filling the first gate recess, the first gate trench, the second gate recess, and the second gate trench further includes:

performing a gate oxidation process to form a gate oxidation layer over exposed portions of the semiconductor substrate;

forming a polysilicon layer over the semiconductor substrate to fill the gate recesses and trenches;

forming a conductive layer over the polysilicon layer; and forming a hard mask layer over the conductive layer.

10. The method of claim 9, further including:

forming a gate spacer, wherein forming the gate spacer includes:

etching the polysilicon layer, the conductive layer, and the hard mask layer to form first and second gates, forming a second nitride layer over the semiconductor substrate including the gates, and etching the second nitride layer to form gate spacers over sidewalls of the first and second gates.

* * * * *